(12) United States Patent
Thurston et al.

(10) Patent No.: US 7,770,078 B2
(45) Date of Patent: Aug. 3, 2010

(54) INTEGRATED CIRCUIT COMMUNICATION SELF-TESTING

(75) Inventors: Jason Thurston, Raleigh, NC (US); Carl Thomas Gray, Apex, NC (US)

(73) Assignee: ARM Limited, Cambridge (GB)

( * ) Notice: Subject to any disclaimer, the term of this patent is extended or adjusted under 35 U.S.C. 154(b) by 251 days.

(21) Appl. No.: 12/153,795

(22) Filed: May 23, 2008

(65) Prior Publication Data

US 2009/0292961 A1    Nov. 26, 2009

(51) Int. Cl.
*G01R 31/28* (2006.01)
(52) U.S. Cl. .................. 714/715; 714/733
(58) Field of Classification Search ............ 257/48; 365/189.09; 714/736, 700, 724, 715, 733
See application file for complete search history.

(56) References Cited

U.S. PATENT DOCUMENTS

| | | | | |
|---|---|---|---|---|
| 6,163,867 | A * | 12/2000 | Miller et al. | 714/736 |
| 7,243,272 | B2 * | 7/2007 | Tarango et al. | 714/700 |
| 2007/0101214 | A1 * | 5/2007 | Stauffer et al. | 714/724 |
| 2008/0237587 | A1 * | 10/2008 | Nierle et al. | 257/48 |
| 2008/0285358 | A1 * | 11/2008 | Nierle | 365/189.09 |

* cited by examiner

*Primary Examiner*—David Ton
(74) *Attorney, Agent, or Firm*—Nixon & Vanderhye P.C.

(57) ABSTRACT

An integrated circuit 2 includes a plurality of serial data transmitters 18 and a plurality of serial data receivers 20. On-chip test signal paths 22 with associated on-chip test circuits 24, 26, 28 are provided so as to permit on-chip serial data communication to be performed with test characteristics imposed by the on-chip test circuits 24, 26, 28 thereby providing on-chip stress testing of the data transmitter 18 and the serial data receiver 20.

12 Claims, 3 Drawing Sheets

INTEGRATED CIRCUIT COMMUNICATION SELF-TESTING

BACKGROUND OF THE INVENTION

1. Field of the Invention

This invention relates to the field of integrated circuits. More particularly, this invention relates to the field of testing communication circuits within an integrated circuit.

2. Description of the Prior Art

It is known to provide integrated circuits with serial data transmitters and serial data receivers. As data rates increase and the performance required from integrated circuits increases, so does the requirement for effective testing of the serial data communication mechanisms provided within the integrated circuit. The known approach to testing integrated circuits is to use external test equipment to which the integrated circuits are connected. This external equipment can exchange serial data signals with the integrated circuit under test and vary signal characteristics so as to stress test the serial data transmitter and serial data receiver provided on the integrated circuit. A disadvantage of this known technique is the cost, complication and relative low speed of the external test equipment.

SUMMARY OF THE INVENTION

Viewed from one aspect the present invention provides an integrated circuit comprising:

at least one serial data transmitter;

at least one serial data receiver coupled to said at least one serial data transmitter to provide data communication therewith; and at least one on-chip test circuit disposed in a test signal path between said at least one serial data transmitter and said at least one serial data receiver to generate at least one test characteristic in a serial data signal sent therebetween so as to stress test said data communication.

The present technique recognises that the overhead associated with the provision of on-chip test circuits and test signal paths so as to stress test the data communication is more than justified in the context of an integrated circuit when viewed as a whole. The provision of the on-chip testing mechanisms reduces cost, complexity and increases speed associated with the testing of the communication mechanisms. The testing can be manufacturing test to determine whether an individual integrated circuit is correctly manufactured, design characterisation seeking to check that the communication circuitry has the required or specified design characteristics and/or debug testing to check that an integrated circuit functions so as to correctly receive/transmit data in operation.

The on-chip test circuit can include a wide variety of circuit elements seeking to provide a corresponding variety of test characteristics in the serial data signal to be communicated. These test characteristics can be applied orthogonally or in a variety of combinations.

In some embodiments the on-chip test circuit includes an impedance generating circuit providing a programmable impedance characteristic in the test signal path. The ability to continue successful communication when the communication path has a range of impedance values is a significant performance characteristic and accordingly the impedance generating circuit provided on the test signal path permits correct operation in respect of this parameter to be efficiently tested.

The impedance generating circuit can include a programmable resistance circuit providing a programmable serial resistance in the test signal path. The impedance generating circuit can additionally/attentively include a programmable capacitance circuit providing a programmable capacitance between the test signal path and a signal ground. In this way, the impedance generating circuit is able to provide a programmable RC characteristic so as to vary the impedance within the test signal path and investigate the ability of the serial data transmitter and the serial data receiver to cope with such variation in impedance.

An integrated circuit will often include a plurality of lanes of data communication each having an associated serial data communication circuit including a serial data transmitter and a serial data receiver. In this context a test signal path may be provided to support data communication from a serial data transmitter of a first serial data communication circuit to a serial data receiver of a second data communication circuit. Thus, point-to-point test communication can be performed on-chip with test characteristics imposed by the on-chip test circuit so as to stress test the communication mechanisms.

While it is possible that only some of the serial data communication circuits need include an on-chip test circuit, more flexibility and a wider range of test coverage may be achieved when each serial data communication circuit includes an on-chip test circuit.

While it is possible that the integrated circuit may include a single test signal path which is shared by the various elements for which it is desired to test communication (and correct operation), flexibility and test coverage are improved by the provision of a plurality of test signal paths.

The flexibility of use of the plurality of test signal paths is improved when each serial data communication circuit comprises a programmable connection circuit providing a programmable connection to one or more of the plurality of test signal paths. In this way, the test signal path coupled to an individual serial data communication circuit may be programmably selected so as to configure the communication path to be used by the test.

It will be appreciated that the circuit elements imposing the test characteristics upon the serial data signal to be transmitted could be positioned at a variety of points along the test signal path. It is convenient that at least the impedance generating circuit is disposed between the test signal path and the serial data receiver, i.e. at the receiver end of a communication link.

Some embodiments of the integrated circuit may include a crosstalk capacitance circuit providing a programmable capacitance coupling between at least two of the plurality of test signal paths so as to generate crosstalk interference therebetween. This enables stress testing as a consequence of crosstalk interference to be investigated on-chip.

Viewed from another aspect the present invention provides an integrated circuit comprising:

at least one serial data transmitting means for transmitting serial data;

at least one serial data receiving means for receiving serial data, said at least one serial data receiving being coupled to said at least one serial data transmitting means to provide data communication therewith; and at least one on-chip test means disposed in a test signal path between said at least one serial data transmitting means and said at least one serial data receiving means for generating at least one test characteristic in a serial data signal sent therebetween so as to stress test said data communication.

Viewed from a further aspect the present invention provides a method of testing an integrated circuit, said method comprising the steps of:

transmitting serial data using at least one serial data transmitter;

receiving serial data using at least one serial data receiver coupled to said at least one serial data transmitting means to provide data communication therewith ; and generating at least one test characteristic in a serial data signal so as to stress test said data communication using at least one on-chip test means disposed in a test signal path between said at least one serial data transmitter and said at least one serial data receiver.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
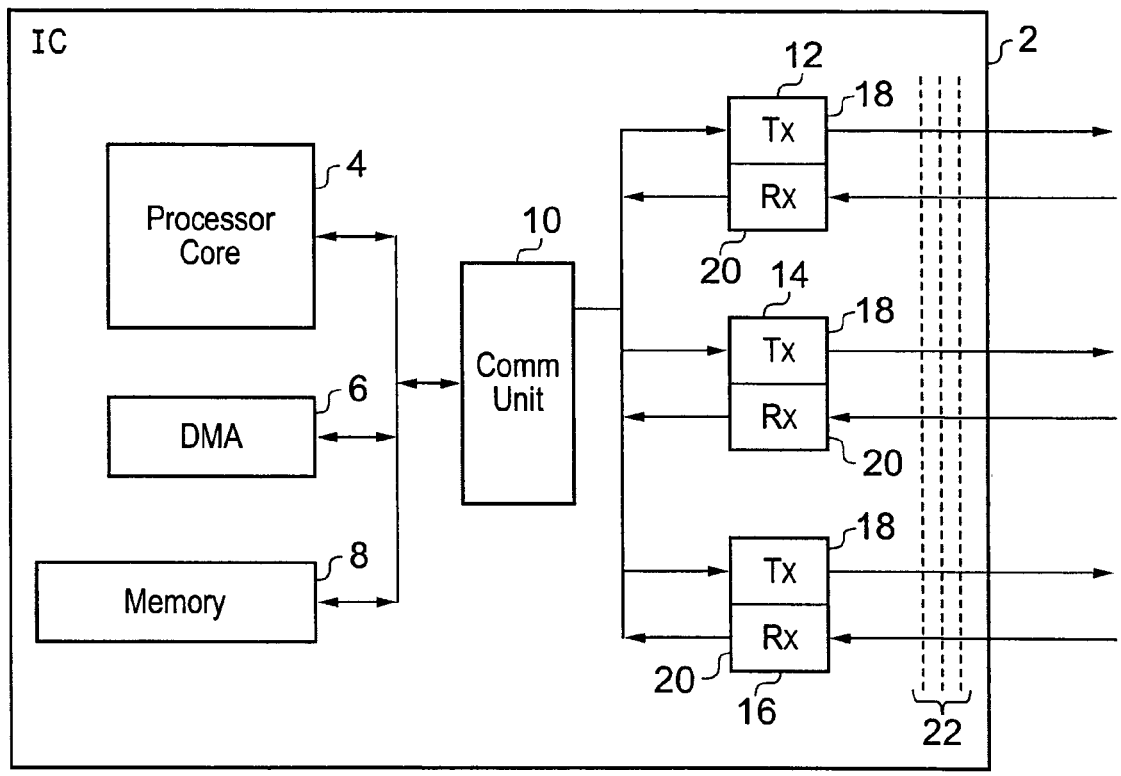
FIG. 1 schematically illustrates an integrated circuit including on-chip testing mechanisms for serial data communication.

FIG. 1 schematically illustrates an integrated circuit 2 including a processor core 4, a DMA unit 6, a memory 8, a communication unit 10 and a plurality of serial communication units 12, 14, 16. It will be appreciated that the integrated circuit 2 may typically comprise many further circuit blocks and the circuit blocks can vary in nature.

Each of the serial communication circuits 12, 14, 16 comprises a serial data transmitter 18 and a serial data receiver 20 for providing off-chip communication during an operational (non-test) mode. The serial data transmitters 18 and the serial data receivers 20 are selectively coupled to a plurality of on-chip test signal paths 22 during a test mode.

During the on-chip testing of the integrated circuit 2 the test signal paths 22 are used to establish serial data communication between a serial data transmitter 18 and a serial data receiver 20 (this could be one-to-one or one-to-many communication). The correct capture of the serial data carried by the serial data signal upon the test signal path 22 may be checked and accordingly the correct operation of the communication verified. On-chip test circuits (discussed further below) are provided to impose test characteristics upon the serial data signal to be transmitted so as to stress test the serial data receivers 18 and/or the serial data transmitters 20. The testing being performed can be manufacturing test to check that an individual integrated circuit has been correctly manufactured. Another form of test is design characterization whereby the characteristics of operation of the communication mechanisms may be determined for the purposes, for example, of checking that the communication mechanisms meet a required design specification. A further form of testing is debug testing in which correct functioning of the communication circuits under operational conditions may be checked.

Figure 2:
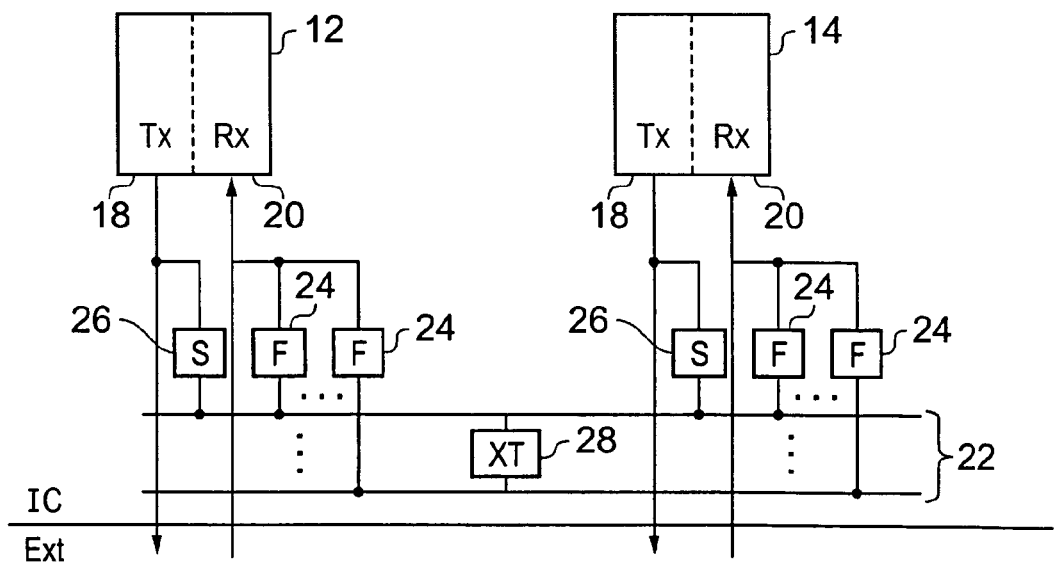
FIG. 2 schematically illustrates a plurality of serial data communication circuits linked via a plurality of test signal paths and including a plurality of on-chip test circuits for imposing test characteristics upon serial data signals to be communicated.

FIG. 2 schematically illustrates a portion of the integrated circuit 2 in more detail. This portion includes a plurality of serial data communication circuits 12, 14 coupled to a plurality of test signal paths 22 all provided on-chip. In the non-test mode of operation the serial data communication circuits 12, 14 transmit serial data off-chip and receive serial data from off-chip. The test signal paths 22 provide an alternative communication path which can be used to self-test the integrated circuit.

Illustrated in FIG. 2 are a plurality of impedance generating circuits 24 associated with each serial data receiver 20. These impedance generating circuits 24 may be used to generate desired RC characteristics associated with a test signal path 22 being used. RC characteristics influence the distortion of a serial data signal being transmitted and accordingly permit stress testing of the ability of a serial data receiver 20 to correctly capture the data values being transmitted via that serial data signal. Providing a variety of degrees of degradation of the signal using different RC characteristics of the test signal path 22 enables the limits in the operation of the serial data receiver 20 to be established for a variety of test purposes as previously discussed. Programmable connection circuits 26 are associated with each serial data transmitter 18 and serve to permit the test signal path 22 being used between a serial data transmitter 18 and a serial data receiver 20 to be selected as desired. Different combinations of serial data transmitter 18 and serial data receiver 20 may be formed with different lengths of test signal paths as well as different test characteristics imposed upon those signal paths.

A crosstalk capacitance circuit 28 is provided between test signal paths 22 so as to generate crosstalk interference therebetween. This can be used to test the resistance of the serial data transmitter 18 and the serial data receiver 20 to such crosstalk interference degrading correct serial data capture.

It will be appreciated from the above that only some of the characteristics of the serial data signal which may be varied by the on-chip test circuit so as to provide test characteristics have been described. Further characteristics may be envisaged and are encompassed by the present technique.

Figure 3:
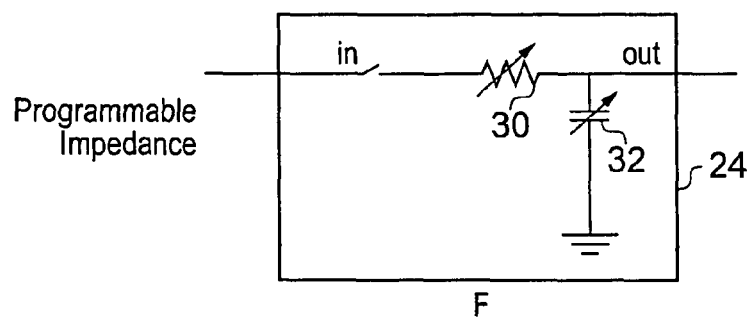
FIG. 3 schematically illustrates an impedance generating circuit providing a programmable impedance characteristic.

FIG. 3 schematically illustrates an impedance generating circuit 24. The impedance generating circuit 24 uses a programmable resistance circuit 30 and a programmable capacitance circuit 32 in order to provide a desired RC characteristic between its input and its output. The impedance generating circuit 34 is in this example embodiment provided at the receiver end of the signal path. In other embodiments the impedance generating circuit 24 could be provided at the transmitter end of the signal path or at some intermediate point.

Figure 4:
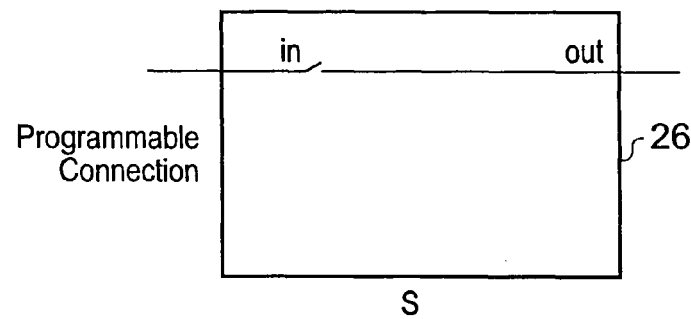
FIG. 4 schematically illustrates a programmable connection circuit providing a programmable connection to one or more test signal paths.

FIG. 4 schematically illustrates a programmable connection circuit 26. This programmable connection circuit 26 is schematically illustrated as a simple switch for connecting a serial data transmitter 18 to an appropriate test signal path 22. Multiple programmable connection circuits 26 may be associated with each serial data transmitter 18 such that a range of test signal paths 22 may be selected from for use in a stress test to be performed.

Figure 5:
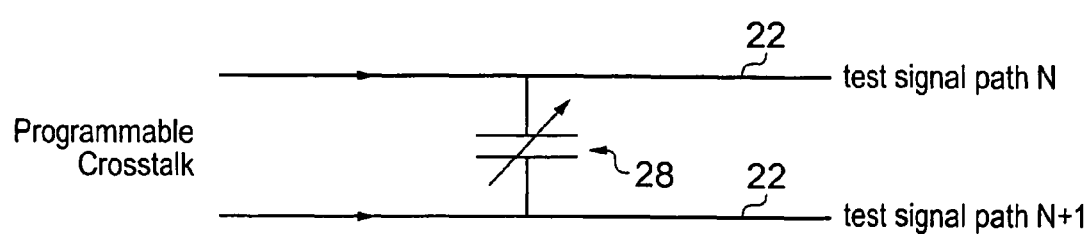
FIG. 5 schematically illustrates a crosstalk capacitance circuit providing a programmable capacitive coupling between two test signal paths.

FIG. 5 schematically illustrates a crosstalk capacitance circuit 28 provided between test signal paths 22 so as to generate a programmable degree of crosstalk interference therebetween. Crosstalk interference can effect the performance of both the serial data transmitter 18 and the serial data receiver 20 so as to stress test either or both of these elements. The crosstalk capacitance circuit 18 can be selectively switched in between a desired pair of test signal paths 22 using appropriate multiplexers (not illustrated).

Figure 6:
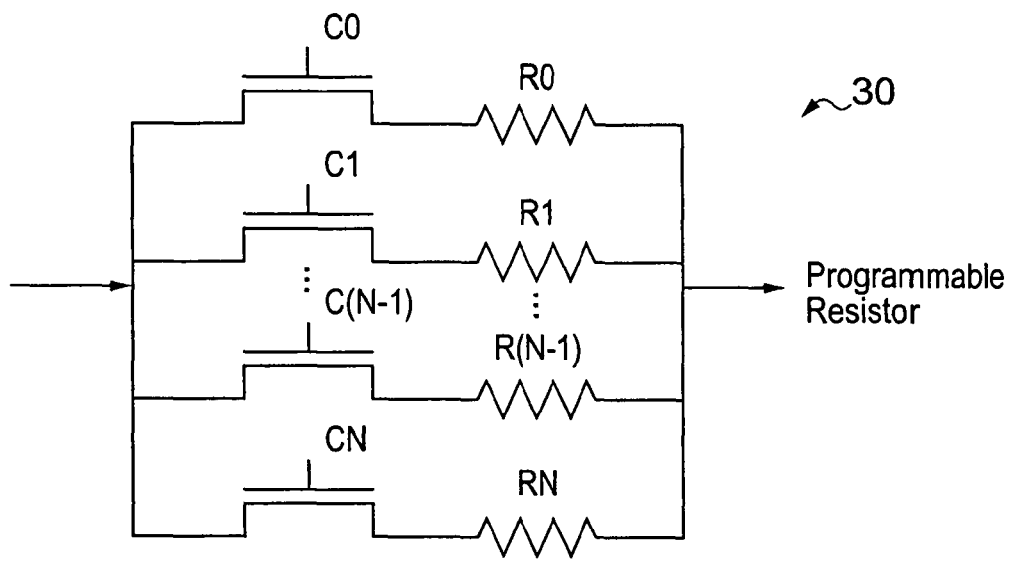
FIG. 6 schematically illustrates a programmable resistor.

FIG. 6 illustrates one example form of a programmable resistance 30. This programmable resistance 30 comprises a plurality of resistors connected in parallel and each gated by an associated transistor. Control signals switching on and off the transistors select which of the resistors are in the parallel network. In this way, a desired resistance value between the input and output of the programmable resistance circuit as a whole can be achieved. The control signals applied to the transistors may be digital control signals. In an alternative embodiment analog control may be used to achieve variable resistance by adjusting the conductance through a transistor or by other analog circuit control mechanisms.

Figure 7:
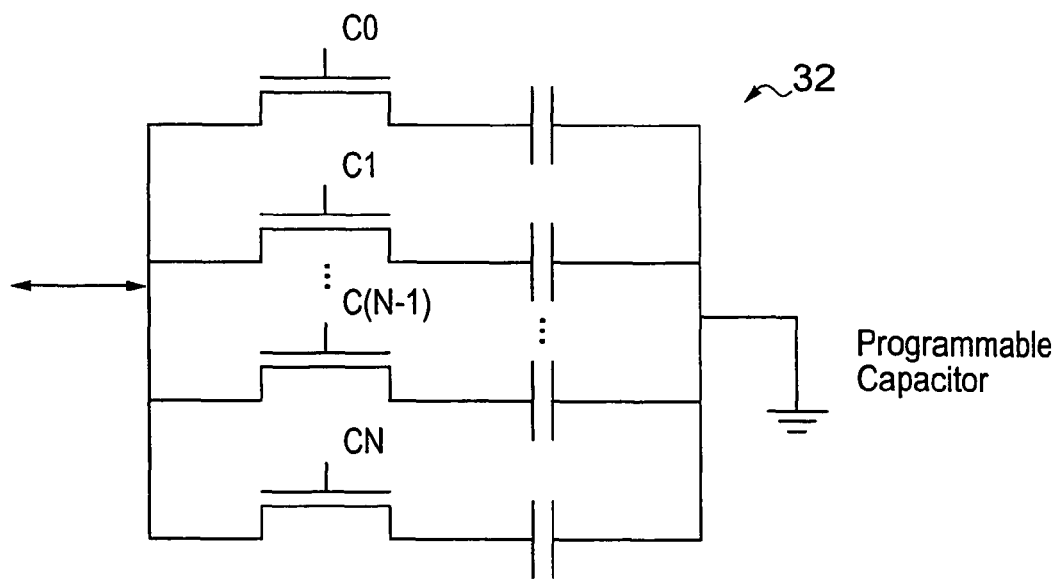
FIG. 7 schematically illustrates a programmable capacitor.

FIG. 7 illustrates one example form of a programmable capacitor 32. This programmable capacitor comprises a network of parallel individual capacitors each switched into or out of connection by an associated gate controlled by an individual control signal. Again the control signals may be digitally generated. Variable capacitance may also be provided with other circuit elements, such as a varactor.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An integrated circuit comprising:
    at least one serial data transmitter;
    at least one serial data receiver coupled to said at least one serial data transmitter to provide data communication therewith; and
    at least one on-chip test circuit disposed in a test signal path between said at least one serial data transmitter and said at least one serial data receiver to generate at least one test characteristic in a serial data signal sent therebetween so as to stress test said data communication.

2. An integrated circuit as claimed in claim 1, wherein said at least one on-chip test circuit includes an impedance generating circuit providing a programmable impedance characteristic in said test signal path.

3. An integrated circuit as claimed in claim 2, wherein said impedance generating circuit includes a programmable resistance circuit providing a programmable serial resistance in said test signal path.

4. An integrated circuit as claimed in claim 2, wherein said impedance generating circuit includes a programmable capacitance circuit providing a programmable capacitance between said test signal path and a signal ground.

5. An integrated circuit as claimed in claim 2, wherein said impedance generating circuit is disposed between said test signal path and said at least one serial data receiver.

6. An integrated circuit as claimed in claim 1, comprising a plurality of serial data communication circuits, each serial data communication circuit comprising a serial data transmitter and a serial data receiver, and at least one test signal path providing data communication from a serial data transmitter of a first serial data communication circuit and a serial data receiver of a second serial data communication circuit.

7. An integrated circuit as claimed in claim 6, wherein each serial data communication circuit comprises an on-chip test circuit.

8. An integrated circuit as claimed in claim 6, comprising a plurality of test signal paths between said plurality serial data communication circuits.

9. An integrated circuit as claimed in claim 7, wherein each serial data communication circuit comprises an on-chip test circuit and each on-chip test circuit comprises a programmable connection circuit providing a programmable connection to one or more of said plurality of test signal paths.

10. An integrated circuit as claimed in claim 8, comprising a crosstalk capacitance circuit providing a programmable capacitive coupling between at least two of said plurality of test signal paths so as to generate crosstalk interference therebetween.

11. An integrated circuit comprising:
    at least one serial data transmitting means for transmitting serial data;
    at least one serial data receiving means for receiving serial data, said at least one serial data receiving being coupled to said at least one serial data transmitting means to provide data communication therewith; and
    at least one on-chip test means disposed in a test signal path between said at least one serial data transmitting means and said at least one serial data receiving means for generating at least one test characteristic in a serial data signal sent therebetween so as to stress test said data communication.

12. A method of testing an integrated circuit, said method comprising the steps of:
    transmitting serial data using at least one serial data transmitter;
    receiving serial data using at least one serial data receiver coupled to said at least one serial data transmitting means to provide data communication therewith; and
    generating at least one test characteristic in a serial data signal so as to stress test said data communication using at least one on-chip test means disposed in a test signal path between said at least one serial data transmitter and said at least one serial data receiver.

* * * * *

UNITED STATES PATENT AND TRADEMARK OFFICE
CERTIFICATE OF CORRECTION

| | | |
|---|---|---|
| PATENT NO. | : 7,770,078 B2 | Page 1 of 1 |
| APPLICATION NO. | : 12/153795 | |
| DATED | : August 3, 2010 | |
| INVENTOR(S) | : Jason Thurston and Carl Thomas Gray | |

It is certified that error appears in the above-identified patent and that said Letters Patent is hereby corrected as shown below:

Column 6, line 19, the words "claim 7," should read -- claim 8, --.

Signed and Sealed this
Twenty-seventh Day of December, 2011

David J. Kappos
*Director of the United States Patent and Trademark Office*